United States Patent
Su

(10) Patent No.: US 7,468,889 B2
(45) Date of Patent: Dec. 23, 2008

(54) THERMAL MODULE FASTENER FOR SERVER BLADE

(75) Inventor: Feng-Qing Su, Tainan Hsien (TW)

(73) Assignee: Adlink Technology Inc., Taipei (TW)

( * ) Notice: Subject to any disclaimer, the term of this patent is extended or adjusted under 35 U.S.C. 154(b) by 73 days.

(21) Appl. No.: 11/750,342

(22) Filed: May 18, 2007

(65) Prior Publication Data

US 2007/0258207 A1    Nov. 8, 2007

Related U.S. Application Data

(63) Continuation-in-part of application No. 11/381,537, filed on May 4, 2006, now abandoned.

(51) Int. Cl.
*H05K 7/20* (2006.01)
*H01R 13/00* (2006.01)
*F28F 7/00* (2006.01)

(52) U.S. Cl. .................. 361/719; 361/720; 361/710; 361/713; 165/80.2; 439/487

(58) Field of Classification Search ............... 361/710, 361/713, 719–720; 165/80.2; 439/487
See application file for complete search history.

(56) References Cited

U.S. PATENT DOCUMENTS

| | | | | |
|---|---|---|---|---|
| 5,713,690 A * | 2/1998 | Corbin et al. | ............... | 403/270 |
| 6,477,053 B1 * | 11/2002 | Zeidan et al. | ............... | 361/719 |
| 6,545,879 B1 * | 4/2003 | Goodwin | ............... | 361/807 |
| 6,611,431 B1 * | 8/2003 | Lee et al. | ............... | 361/719 |
| 6,791,838 B1 * | 9/2004 | Hung et al. | ............... | 361/704 |
| 6,826,054 B2 * | 11/2004 | Liu | ............... | 361/719 |
| 6,859,368 B2 * | 2/2005 | Yang | ............... | 361/704 |
| 7,019,979 B2 * | 3/2006 | Wang et al. | ............... | 361/719 |
| 7,042,727 B2 * | 5/2006 | Ulen et al. | ............... | 361/704 |
| 7,283,368 B2 * | 10/2007 | Wung et al. | ............... | 361/719 |
| 2004/0052054 A1 * | 3/2004 | Huang et al. | ............... | 361/719 |
| 2006/0007659 A1 * | 1/2006 | Lee et al. | ............... | 361/704 |
| 2006/0245165 A1 * | 11/2006 | Lin | ............... | 361/704 |

* cited by examiner

*Primary Examiner*—Jayprakash N Gandhi
*Assistant Examiner*—Bradley H Thomas

(57) ABSTRACT

A fastener used in a blade server to secure a thermal module and a motherboard to a metal face panel, including a cushion member set between the metal face panel and the motherboard, an elastically compressible and electrically insulative spacer member set between the motherboard and the thermal module, a lock member fastened to the cushion member and the spacer member to lock the motherboard to the metal face panel, a locating member fastening the thermal module to the spacer member, and a spring member mounted on the locating member to keep the thermal module in close contact with a chip at the motherboard. The spacer member automatically adjusts the tightness between the thermal module and the chip at the motherboard, and isolates the digital grounding loop formed in the locating member and the thermal module from the analog grounding loop formed in the lock member and the metal face panel.

6 Claims, 5 Drawing Sheets

THERMAL MODULE FASTENER FOR SERVER BLADE

This application is a Continuation-In-Part of my patent application, Ser. No. 11/381,537, filed on May 4, 2006 now abandoned.

BACKGROUND OF THE INVENTION

1. Field of the Invention

The present invention relates to a blade server and more specifically, to a fastener that secures a thermal module and a motherboard to a metal face panel, which uses a locating member, a cushion member, a spacer member and a lock member to fasten a thermal module and a metal face panel to a motherboard, keeping the thermal module electrically insolated from the metal face panel and in close contact with a chip at the motherboard for quick dissipation of heat. The spacer member is elastically compressible and electrically insulative, therefore the spacer member automatically adjusts the tightness between the thermal module and the chip at the motherboard, and isolates the digital grounding loop formed in the locating member and the thermal module from the analog grounding loop formed in the lock member and the metal face panel.

2. Description of the Related Art

At the present time, many enterprises install several tens or even several hundreds of mini servers to satisfy network traffic requirements. In order to improve further economic effect, blade servers are developed. A blade server is essentially a housing for a number of individual minimally-packaged computer motherboard "blades". Each blade is a server in its own right, often dedicated to a single application, containing one or more processors, computer memory, computer storage, and computer network connections and controllers, and other input/output ports. Server blades share the common power supply and air-cooling resources of the chassis. Blade servers allow more processing power in less rack space, simplifying cabling and reducing power consumption. The most attractive advantage of a blade server is its high reliability and extendibility. Every blade server has the backup function. The chassis supports hot plugging of the blade servers and system component parts, providing high applicability. When one individual blade fails, another blade can take the place without interrupting the service of the system. When wishing to increase the processing power of the system, one needs only to insert more server blades and to arrange these resources at the place where the demand is most strong.

Further, in a regular ATCA blade server, dual-CPU architecture complicates heat dissipation arrangement. Installation of a thermal module in a regular ATCA blade server must consider the arrangement of dual-CPU, INTEL Xeon, one Northbridge chip, and two PXH chips. It is complicated to install a thermal module in a blade server. Directly mounting a thermal module on the motherboard of a blade server may cause the motherboard to deform or to break due to the heavy gravity weight of the thermal module. In order to protect the motherboard against deformation, a metal face panel may be used and provided at the bottom side of the motherboard to reinforce the structural strength of the motherboard.

According to ATCA protocol, the thermal module itself pertains to digital grounding and the metal face panel pertains to analog grounding. Digital grounding signal and analog grounding signal must be isolated, preventing interference. Therefore, blade server providers are trying hard to find a thermal module mounting arrangement that effectively secures a thermal module to a motherboard and a metal face panel, keeping the thermal module and the metal face panel electrically insulated from each other.

SUMMARY OF THE INVENTION

The present invention has been accomplished under the circumstances in view. According to one aspect of the present invention, the thermal module fastener comprises a cushion member set between a metal face panel and a motherboard, an elastically compressible and electrically insulative spacer member set between the motherboard and a thermal module, a lock member fastened to the cushion member and the spacer member to lock the motherboard to the metal face panel, a locating member fastening the thermal module to the spacer member, and a spring member mounted on the locating member to keep the thermal module in close contact with a chip at the motherboard. By means of the thermal module fastener to affix the metal face panel and the thermal module to the motherboard, the thermal module is electrically insolated from the metal face panel, and the metal face panel effectively reinforces the structural strength of the motherboard against deformation.

According to another aspect of the present invention, the elastically compressible and electrically insulative spacer member automatically adjusts the tightness between the thermal module and the chip at the motherboard, and isolates the digital grounding loop formed in the locating member and the thermal module from the analog grounding loop formed in the lock member and the metal face panel.

DETAILED DESCRIPTION OF THE PREFERRED EMBODIMENT

Figure 1:
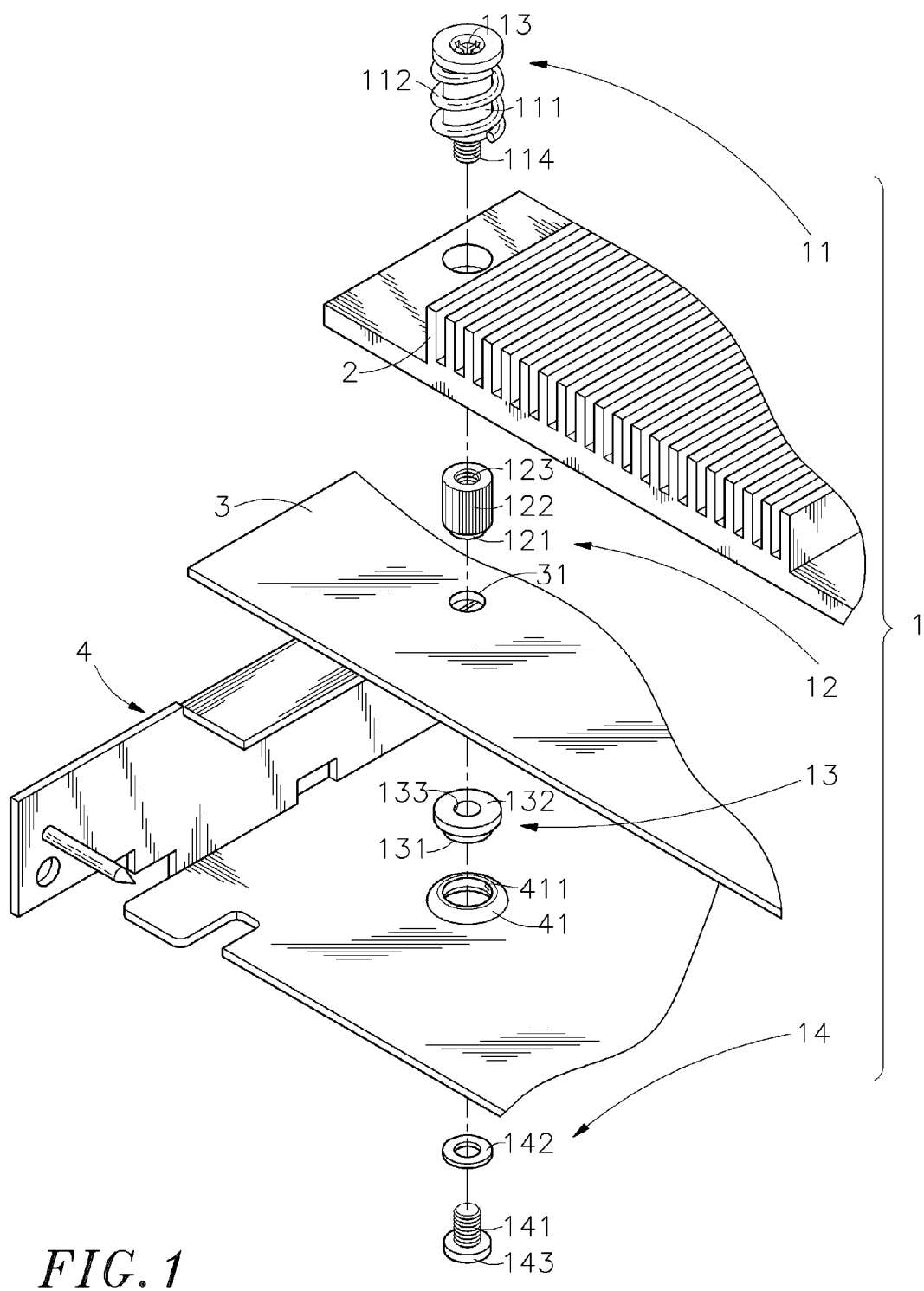
FIG. 1 is an exploded view of the preferred embodiment of the present invention.
Figure 2:
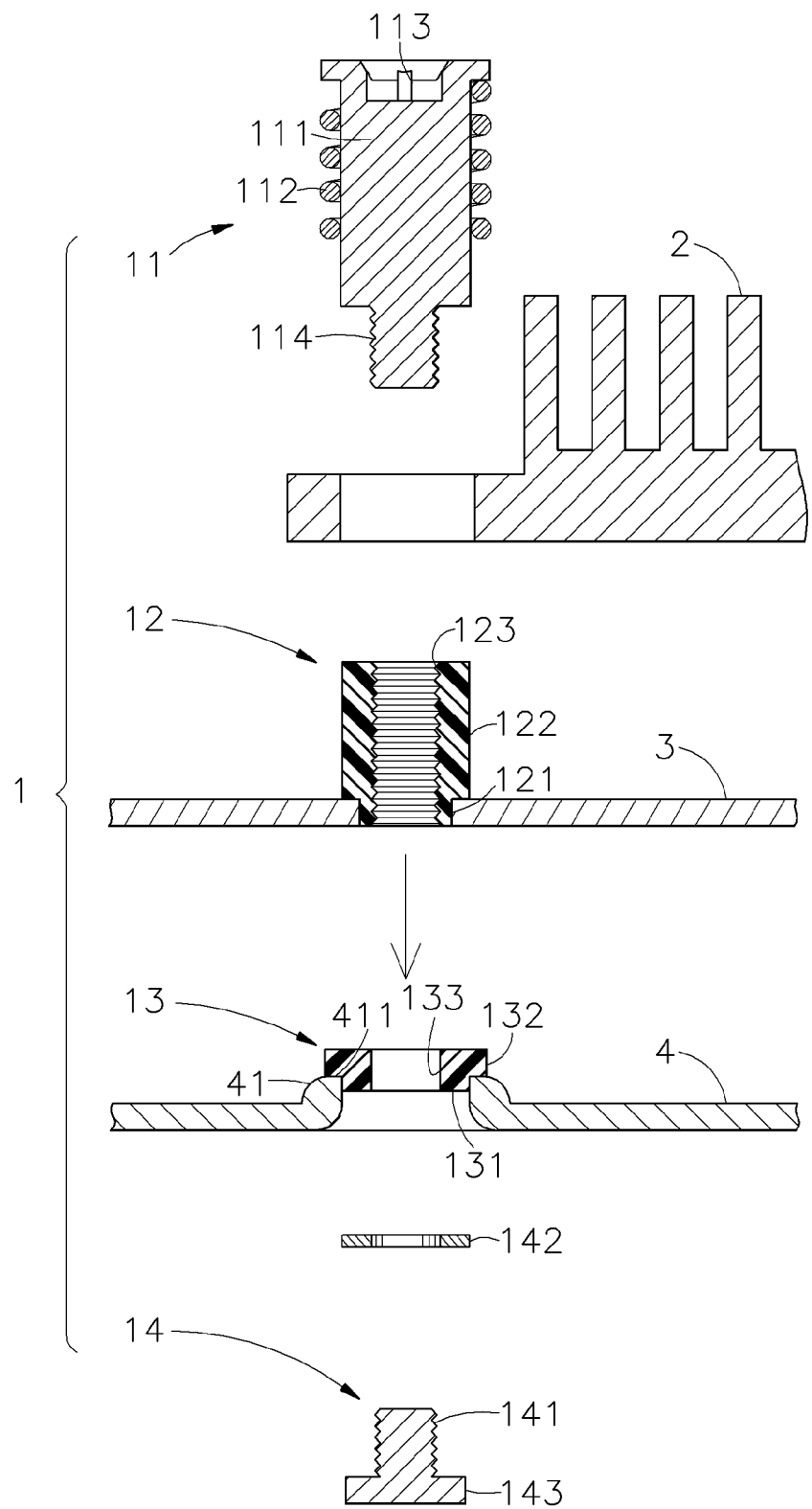
FIG. 2 is a sectional side assembly view of the preferred embodiment of the present invention (I).

Referring to FIGS. 1~5, a thermal module fastener 1 in accordance with the present invention is shown comprised of a locating member 11, a spacer member 12, a cushion member 13 and a lock member 14.

The locating member 11 is mounted on a thermal module 2 at the top side, having a cylindrical body 111, a socket head 113 at one end, namely, the top end of the cylindrical body 111, a connection tip 114 axially extending from the other end, namely, the bottom end of the cylindrical body 111 and suspending below the thermal module 2, and a buffer member, for example, coil spring 112 sleeved onto the cylindrical body 111 and stopped between the outside wall of the socket head 113 and the top wall of the thermal module 2.

The spacer member 12 is made of an electrically insulative and elastically compressible material, having a spacer block 122 stopped between the thermal module 2 and a motherboard 3, a positioning portion 121 axially downwardly extending from the bottom end of the spacer block 122 and positioned in a through hole 31 of the motherboard 3, and a screw hole 123 axially extending through the spacer block 122 and the positioning portion 121. The height of the spacer block 122 has a diameter greater than the positioning portion 121 and is determined subject to heights of the electronic devices (not shown) on the motherboard 3.

The cushion member 13 is made of an electrically insulative material and set between the motherboard 3 and a metal face panel 4, having a bottom positioning portion 131, a top bearing portion 132, and a center screw hole 133 extending through the bottom positioning portion 131 and the top bearing portion 132. The top bearing portion 132 has a diameter greater than the bottom positioning portion 131.

The lock member 14 is a lock screw mounted in the bottom side of the metal face panel 4 and fastened to the motherboard 3, having a head 143 and a threaded shank 141 extending from one side of the head 143. Further, the shank 141 is mounted with a washer 142.

Figure 3:
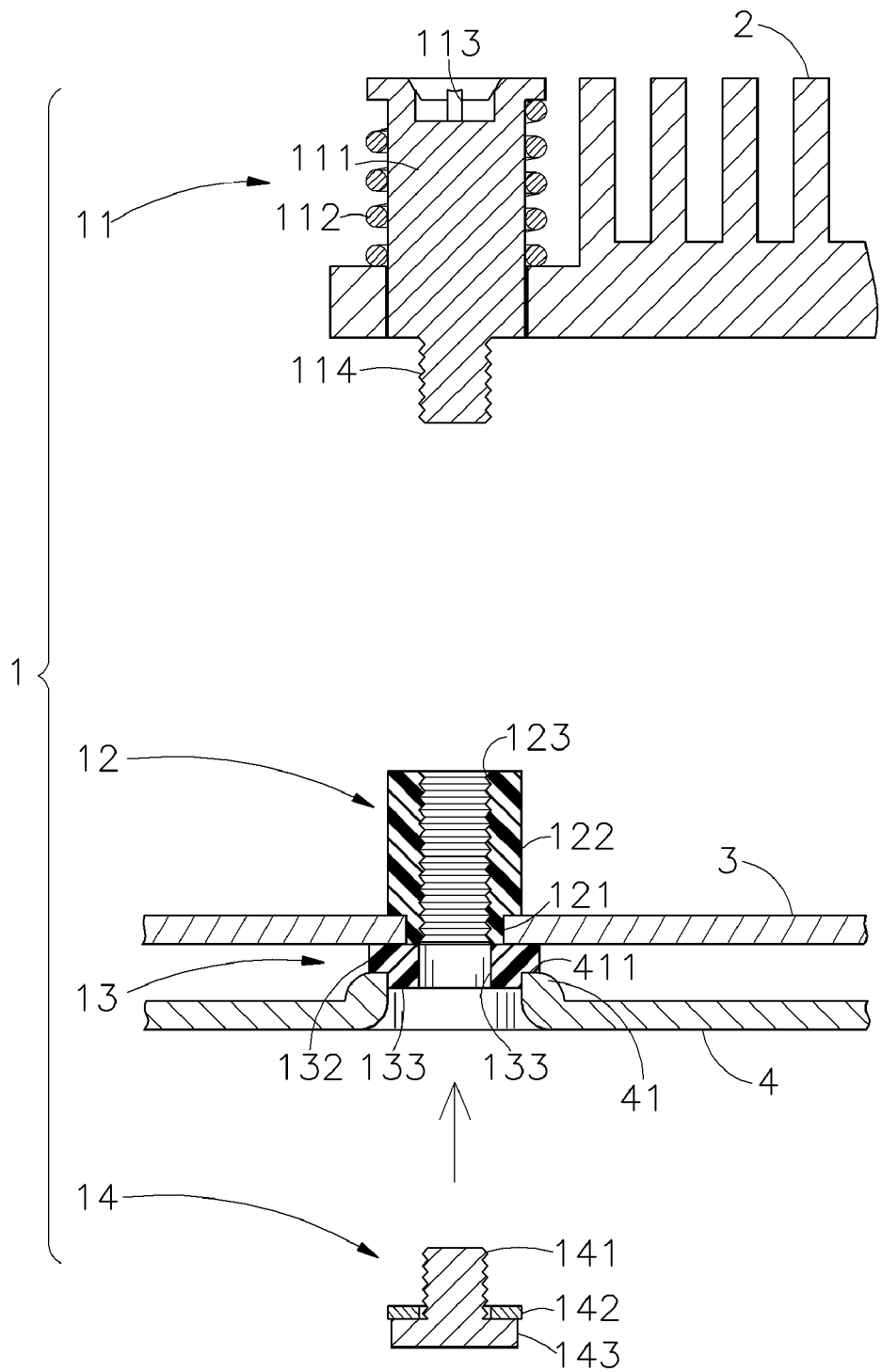
FIG. 3 is a sectional side assembly view of the preferred embodiment of the present invention (II).
Figure 4:
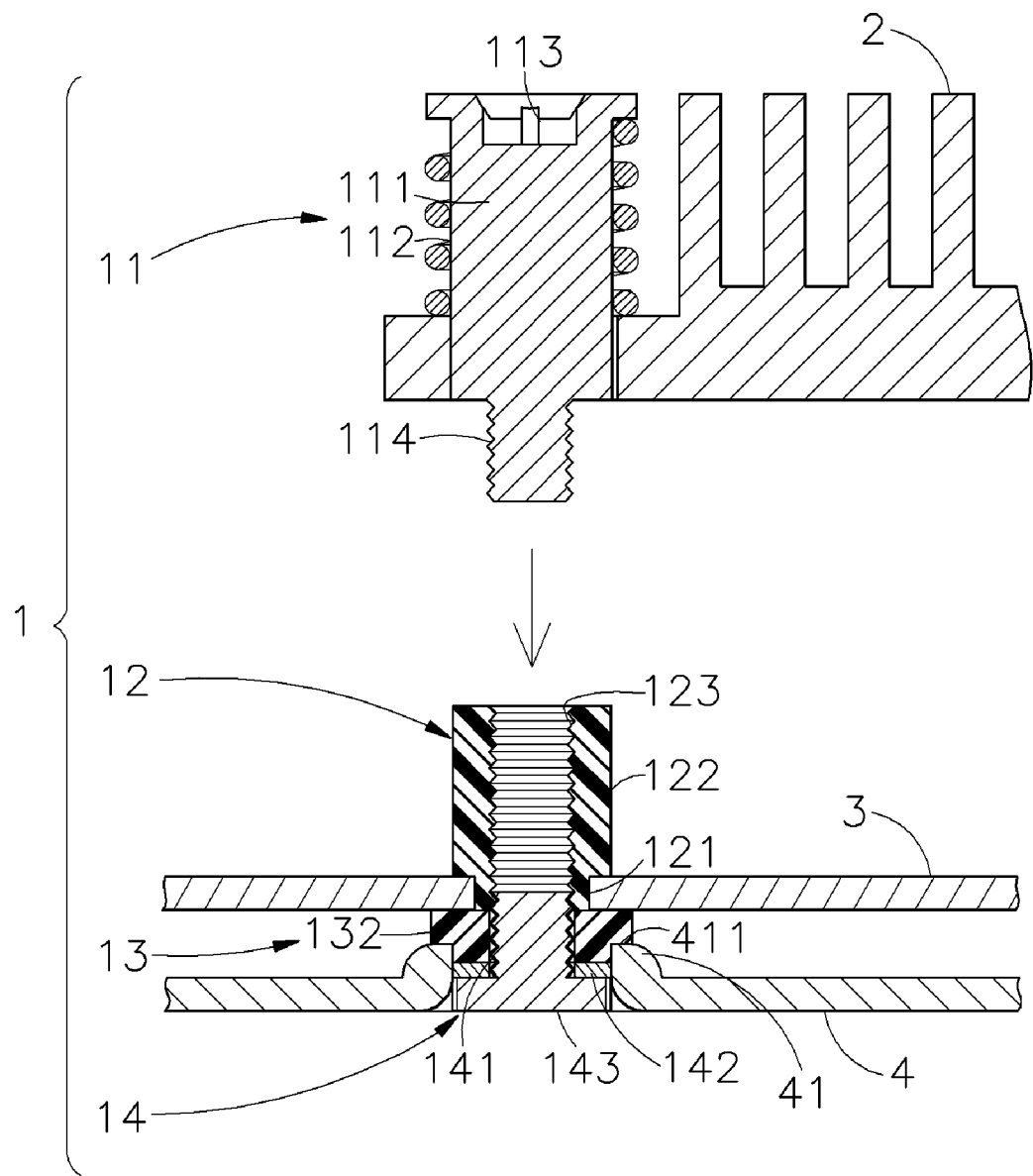
FIG. 4 is a sectional side assembly view of the preferred embodiment of the present invention (III).
Figure 5:
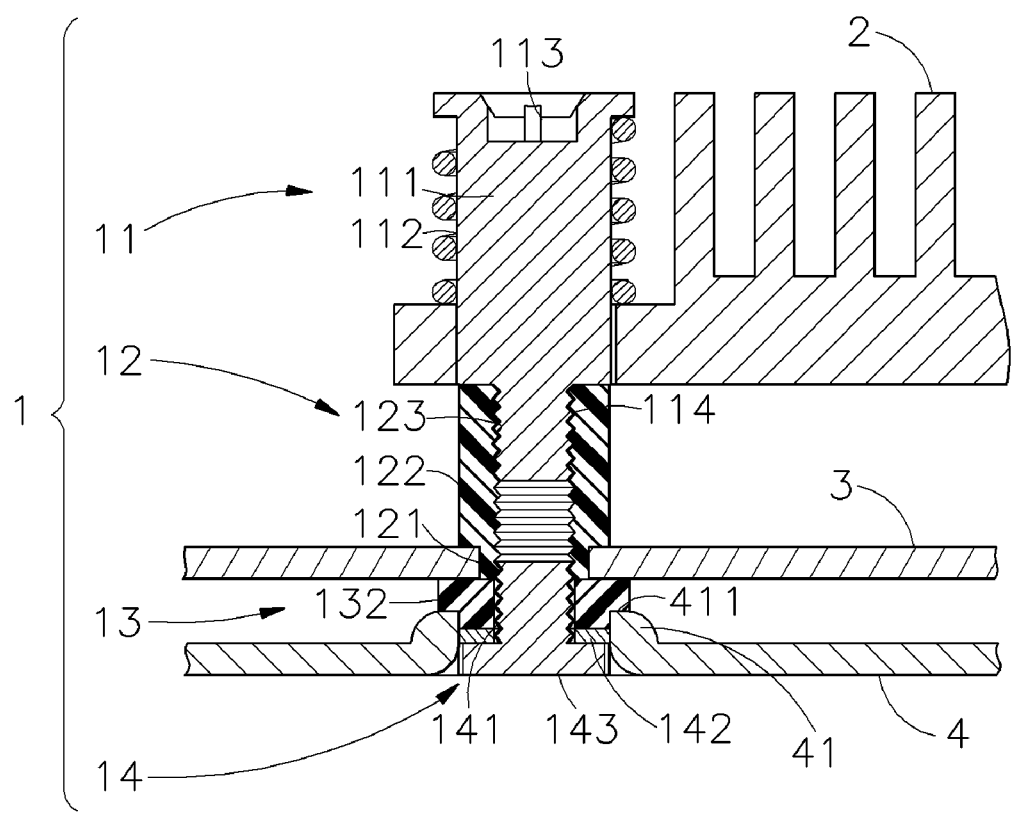
FIG. 5 is a sectional side assembly view of the preferred embodiment of the present invention (IV).

The installation procedure of the present invention is outlined hereinafter with reference to FIGS. 3~5. The bottom positioning portion 131 of the cushion member 13 is engaged into a mounting through hole 411 of the metal face panel 4 with the top bearing portion 132 supported on a raised portion 41 of the metal face panel 4 around the mounting through hole 411 to keep the center screw hole 133 in axial alignment with the mounting through hole 411, and then the positioning portion 121 of the spacer member 12 is soldered to a corresponding through hole 31 on the motherboard 3 to keep the screw hole 123 in axial alignment with the through hole 31, and then the motherboard 3 is positioned on the metal face panel 4, and then the threaded shank 141 of the lock member 14 is mounted with the washer 142 and then inserted through the mounting through hole 411 of the metal face panel 4 and threaded into the center screw hole 133 of the cushion member 13 and the screw hole 123 of the spacer member 12 from the bottom side, and then the thermal module 2 is supported on the spacer member 12, and the cylindrical body 111 of the locating member 11 is mounted with the coil spring 112 and inserted into the thermal module 2, and then the locating member 11 is rotated to thread the connection tip 114 of the locating member 11 into the screw hole 123 of the spacer member 12 from the top side.

Further, the chip (not shown) at the motherboard 3 is kept in close contact with the bottom wall of the thermal module 2, and the height of the spacer member 2 is determined subject to heights of the electronic devices or the chip on the motherboard 3. The coil spring 112 is stopped at the top wall of the thermal module 2. When plugging or unplugging the server blade, the thermal module 2 can be moved forwards and backwards relative to the motherboard 3 by means of the buffering effect of the coil spring 112, preventing damage to the motherboard 3.

In application, the thermal module fastener 1 of the present invention provides many features and advantages as follows. The thermal module fastener 1 effectively secures the thermal module 2 to the motherboard 3 and the metal face panel 4 so that the metal face panel 4 reinforces the structural strength of the motherboard 3, protecting the motherboard 3 against deformation or breaking. Further, the grounding signals of the thermal module 2 and the metal face panel 4 are kept apart, preventing signal interference.

Further, the installation of the spacer member 12 is not only to electrically insulate the locating member 11 from the lock member 14 but also to effectively let analog and digital signals be grounded through a respective individual loop, preventing surge and interference of digital signal feedback noises in common analog. The individual loops include the digital grounding loop formed in the locating member 11 and the thermal module 2, and the analog grounding loop formed in the lock member 14 and the metal face panel 4. Further, because the spacer member 12 has an inner thread (in the screw hole 123) and is electrically insulative and elastically compressible, the thermal module fastener 1 effectively adjusts the tightness between the thermal module 2 and the chip at the motherboard 3 through the spacer member 12, and the elastic material property of the spacer member 12 lowers the pressure between the thermal module 2 and the chip at the motherboard 3. By means of the arrangement of the one single spacer member 12, the thermal module fastener 1 achieves adjustment of tightness, absorption of excessive high pressure and the desired electric isolation.

A prototype of thermal module fastener has been constructed with the features of FIGS. 1~5. The thermal module fastener functions smoothly to provide all of the features disclosed earlier.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A thermal module fastener installed in a blade server to secure a thermal module and a motherboard to a metal face panel to keep said thermal module in close contact with an electronic device on said motherboard for dissipating heat from said electronic device and also to keep said thermal module and said metal face panel in different grounding loops, the thermal module fastener comprising:

a cushion member made of an electrically insulative material and set between said motherboard and said metal face panel, said cushion member having a bottom positioning portion fastened to a mounting through hole in said metal face panel, a top bearing portion supported between said metal face panel and said motherboard, and a center screw hole extending through said bottom positioning portion and said top bearing portion;

a spacer member made of an electrically insulative and elastically compressible material, said spacer member having a spacer block set between said thermal module and said motherboard, a positioning portion axially downwardly extending from said spacer block and positioned in a through hole of said motherboard, and a screw hole extending through top and bottom sides thereof in vertical alignment with the center screw hole of said cushion member;

a lock member for locking said motherboard and said cushion member to said metal face panel, said lock member having a head stopped at a bottom side of said metal face panel and a threaded shank perpendicularly extending from said head and threaded into the center screw hole of said cushion member and a bottom end of the screw hole of said spacer member;

a locating member for securing said thermal module to said motherboard, said locating member having a cylindrical body mounted in said thermal module, a socket head disposed at one end of said cylindrical body and spaced above said thermal module, and a connection tip axially downwardly extending from one end of said cylindrical body opposite to said socket head and threaded into a top end of the screw hole of said spacer member;

a digital grounding loop formed in said locating member and said thermal module by means of the connection between said spacer member and said locating member; and an analog grounding loop formed in said lock member and said metal face panel by means of the connection between said spacer member and said locating member and separated from said digital grounding loop.

2. The thermal module fastener as claimed in claim 1, further comprising spring means mounted on the cylindrical body of said locating member and stopped between said socket head of said locating member and said thermal module.

3. The thermal module fastener as claimed in claim 1, wherein the spacer body of said spacer member has a height approximately equal to the height of said electronic device.

4. The thermal module fastener as claimed in claim 1, wherein said top bearing portion of said cushion member is supported between a raised portion of said metal face panel and said motherboard.

5. The thermal module fastener as claimed in claim 1, wherein the positioning portion of said spacer member is soldered to the through hole of said motherboard.

6. The thermal module fastener as claimed in claim 1, further comprising a washer mounted on said threaded shank of said lock member and stopped between the head of said lock member and one side of said metal face panel.

* * * * *